(12) United States Patent
McKittrick et al.

(10) Patent No.: US 11,599,168 B2
(45) Date of Patent: Mar. 7, 2023

(54) EXTENDED THERMAL BATTERY FOR COOLING PORTABLE DEVICES

(71) Applicant: Dell Products L.P., Round Rock, TX (US)

(72) Inventors: Allen B. McKittrick, Cedar Park, TX (US); Pomin Shih, Taipei (TW); Travis North, Cedar Park, TX (US)

(73) Assignee: Dell Products L.P., Round Rock, TX (US)

( * ) Notice: Subject to any disclaimer, the term of this patent is extended or adjusted under 35 U.S.C. 154(b) by 30 days.

(21) Appl. No.: 17/443,560

(22) Filed: Jul. 27, 2021

(65) Prior Publication Data
US 2023/0035904 A1    Feb. 2, 2023

(51) Int. Cl.
*G06F 1/20* (2006.01)
*H05K 9/00* (2006.01)
*H01M 10/613* (2014.01)
*H01M 10/653* (2014.01)
*H05K 7/20* (2006.01)

(52) U.S. Cl.
CPC .......... *G06F 1/203* (2013.01); *H01M 10/613* (2015.04); *H01M 10/653* (2015.04); *H05K 7/20172* (2013.01); *H05K 9/0022* (2013.01); *G06F 2200/201* (2013.01)

(58) Field of Classification Search
CPC .............. G06F 1/203; G06F 2200/201; H01M 10/613; H01M 10/653; H05K 7/20172; H05K 9/0022
See application file for complete search history.

(56) References Cited

U.S. PATENT DOCUMENTS

| | | | | |
|---|---|---|---|---|
| 5,581,443 A | * | 12/1996 | Nakamura | H01L 23/585 257/E23.09 |
| 5,712,762 A | * | 1/1998 | Webb | G06F 1/203 361/679.52 |
| 5,757,615 A | * | 5/1998 | Donahoe | G06F 1/203 361/679.48 |
| 6,141,215 A | * | 10/2000 | Podwalny | G06F 1/203 361/698 |
| 6,175,493 B1 | * | 1/2001 | Gold | G06F 1/203 361/679.55 |
| 6,415,612 B1 | * | 7/2002 | Pokharna | H01L 23/38 62/3.2 |
| 11,452,232 B2 | * | 9/2022 | Wong | G06F 1/203 |

(Continued)

*Primary Examiner* — Michael A Matey
(74) *Attorney, Agent, or Firm* — McDermott Will & Emery LLP (57) ABSTRACT

A cooling system for cooling components in an information handling system contained in a portable chassis comprises a die plate for receiving heat from a component, a heat pipe for transferring heat from the die plate to a single heat exchanger, a fan for generating an airflow across the heat exchanger and a thermal battery. The heat pipe comprises at least one curvature and the thermal battery is coupled to the die plate and has a length and a width such that the thermal battery is in contact with the heat pipe from the die plate to a point past the at least one curvature. The thermal battery may be formed from a thermally conductive material, be a vapor chamber or otherwise facilitate heat transfer to a heat pipe from the die plate to a point past the curvature for improved cooling.

20 Claims, 6 Drawing Sheets

(56) References Cited

U.S. PATENT DOCUMENTS

| | | | | |
|---|---|---|---|---|
| 2002/0154474 A1* | 10/2002 | Merz | G06F 1/1656 | 361/679.55 |
| 2003/0110779 A1* | 6/2003 | Otey | F25B 25/00 | 62/3.2 |
| 2004/0184236 A1* | 9/2004 | Lee | H01L 23/427 | 257/E23.088 |
| 2006/0227509 A1* | 10/2006 | Yang | H01L 23/4093 | 257/E23.099 |
| 2007/0235166 A1* | 10/2007 | Chang | G06F 1/203 | 165/104.33 |
| 2007/0279868 A1* | 12/2007 | Tanaka | G06F 1/203 | 361/702 |
| 2008/0030955 A1* | 2/2008 | Chen | H01L 23/427 | 257/E23.088 |
| 2008/0218963 A1* | 9/2008 | Wu | H01L 23/427 | 165/104.34 |
| 2009/0034202 A1* | 2/2009 | Chiu | G06F 1/26 | 361/704 |
| 2009/0175003 A1* | 7/2009 | Ali | G06F 1/203 | 361/695 |
| 2012/0120542 A1* | 5/2012 | Zhang | H05K 7/20172 | 361/230 |
| 2012/0170210 A1* | 7/2012 | Kim | G06F 1/185 | 165/185 |
| 2013/0077242 A1* | 3/2013 | Hsiao | G06F 1/203 | 415/203 |
| 2013/0314619 A1* | 11/2013 | Sugiura | G06F 1/20 | 348/836 |
| 2014/0096889 A1* | 4/2014 | Casebolt | G06F 1/1633 | 156/213 |
| 2014/0185241 A1* | 7/2014 | Macdonald | H05K 13/00 | 29/592.1 |
| 2014/0192468 A1* | 7/2014 | Kotaka | G06F 1/1616 | 361/679.55 |
| 2015/0212556 A1* | 7/2015 | Hrehor, Jr. | G06F 1/206 | 361/679.48 |
| 2016/0037678 A1* | 2/2016 | Tan | G06F 1/324 | 361/679.46 |
| 2016/0330872 A1* | 11/2016 | Shelnutt | H05K 7/20809 | |
| 2018/0088637 A1* | 3/2018 | Uchino | F28D 15/0275 | |
| 2018/0364773 A1* | 12/2018 | Lu | G06F 1/203 | |
| 2019/0130519 A1* | 5/2019 | Hu | H05K 13/00 | |
| 2020/0058968 A1* | 2/2020 | Thompson | G06F 1/206 | |
| 2020/0089292 A1* | 3/2020 | North | G06F 1/206 | |
| 2022/0007545 A1* | 1/2022 | Embleton | F28D 15/0275 | |
| 2022/0132700 A1* | 4/2022 | Chen | G06F 1/203 | |

* cited by examiner

EXTENDED THERMAL BATTERY FOR COOLING PORTABLE DEVICES

BACKGROUND

Field of the Disclosure

This disclosure relates generally to information handling systems contained in portable chassis and, more particularly, to cooling systems utilizing heat pipes for effectively transferring heat from components in portable chassis.

Description of the Related Art

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

SUMMARY

Embodiments disclosed herein may be generally directed to information handling systems contained in portable chassis and systems and methods utilizing heat pipes for cooling components in portable chassis.

A cooling system for a component in an information handling system contained in a portable chassis may comprise a die plate in thermal contact with a component for receiving heat from the component, a heat exchanger for transferring heat to an airflow, a heat pipe in thermal contact with the die plate for receiving heat from the die plate and in thermal contact with the heat exchanger for transferring heat to the heat exchanger, the heat pipe having at least one curvature between the die plate and the heat exchanger, a fan for generating airflow across the heat exchanger to transfer heat from the heat exchanger to an ambient environment, and a thermal battery coupled to the die plate and in thermal contact with the heat pipe, the thermal battery extending laterally in a first direction past the at least one curvature.

In some embodiments, a first thermal battery extends laterally in the first direction past the at least one curvature, a second thermal battery coupled to the die plate extends laterally in a second direction opposite the first direction, and the heat pipe comprises an end extending laterally in the second direction, wherein the second thermal battery is in thermal contact with the end of the heat pipe extending in the second direction.

In some embodiments, the die plate is in thermal contact with a first component and a thermal battery is in thermal contact with a second component.

In some embodiments, the end of a heat pipe comprises a second curvature and the second thermal battery extends laterally in the second direction past the second curvature.

In some embodiments, the thermal battery comprises a heat chamber comprising a two-phase fluid and a wicking material, or a two-phase material. In some embodiments, the two-phase material comprises a wax.

In some embodiments, a first heat pipe is in contact with the die plate for receiving heat from the die plate and in contact with a first heat exchanger for transferring heat to the first heat exchanger and a second heat is in contact with the die plate for receiving heat from the die plate and in contact with a second heat exchanger for transferring heat to the second heat exchanger. The first heat pipe has at least one curvature between the die plate and the first heat exchanger and the second heat pipe has at least one curvature between the die plate and the second heat exchanger. A first thermal battery is coupled to the die plate and extends laterally in the first direction past the at least one curvature of the first heat pipe and a second thermal battery is coupled to the die plate and extends laterally in the second direction past the at least one curvature of the second heat pipe.

BRIEF DESCRIPTION OF THE DRAWINGS

For a more complete understanding of the invention and its features and advantages, reference is now made to the following description, taken in conjunction with the accompanying drawings, in which.

DESCRIPTION OF PARTICULAR EMBODIMENT(S)

In the following description, details are set forth by way of example to facilitate discussion of the disclosed subject matter. It should be apparent to a person of ordinary skill in the field, however, that the disclosed embodiments are exemplary and not exhaustive of all possible embodiments.

As used herein, a hyphenated form of a reference numeral refers to a specific instance of an element and the un-hyphenated form of the reference numeral refers to the collective or generic element. Thus, for example, heat pipe "114-1" refers to an instance of a heat pipe, which may be referred to collectively as heat pipes "114" and any one of which may be referred to generically as heat pipe "114."

For the purposes of this disclosure, an information handling system may include an instrumentality or aggregate of instrumentalities operable to compute, classify, process, transmit, receive, retrieve, originate, switch, store, display, manifest, detect, record, reproduce, handle, or utilize various forms of information, intelligence, or data for business, scientific, control, entertainment, or other purposes. For example, an information handling system may be a personal computer, a consumer electronic device, a network storage device, or another suitable device and may vary in size, shape, performance, functionality, and price. The information handling system may include memory, one or more processing resources such as a central processing unit (CPU) or hardware or software control logic. Additional components of the information handling system may include one or more storage devices, one or more communications ports for communicating with external devices as well as various input and output (I/O) devices, such as a keyboard, a mouse, and one or more video displays. The information handling system may also include one or more buses operable to transmit communication between the various hardware components.

Embodiments disclosed herein are described with respect to information handling systems in portable chassis with cooling requirements but limited space for cooling systems, but may also be practiced with other chassis. Particular embodiments are best understood by reference to FIGS. 1-8, wherein like numbers are used to indicate like and corresponding parts.

Figure 1:
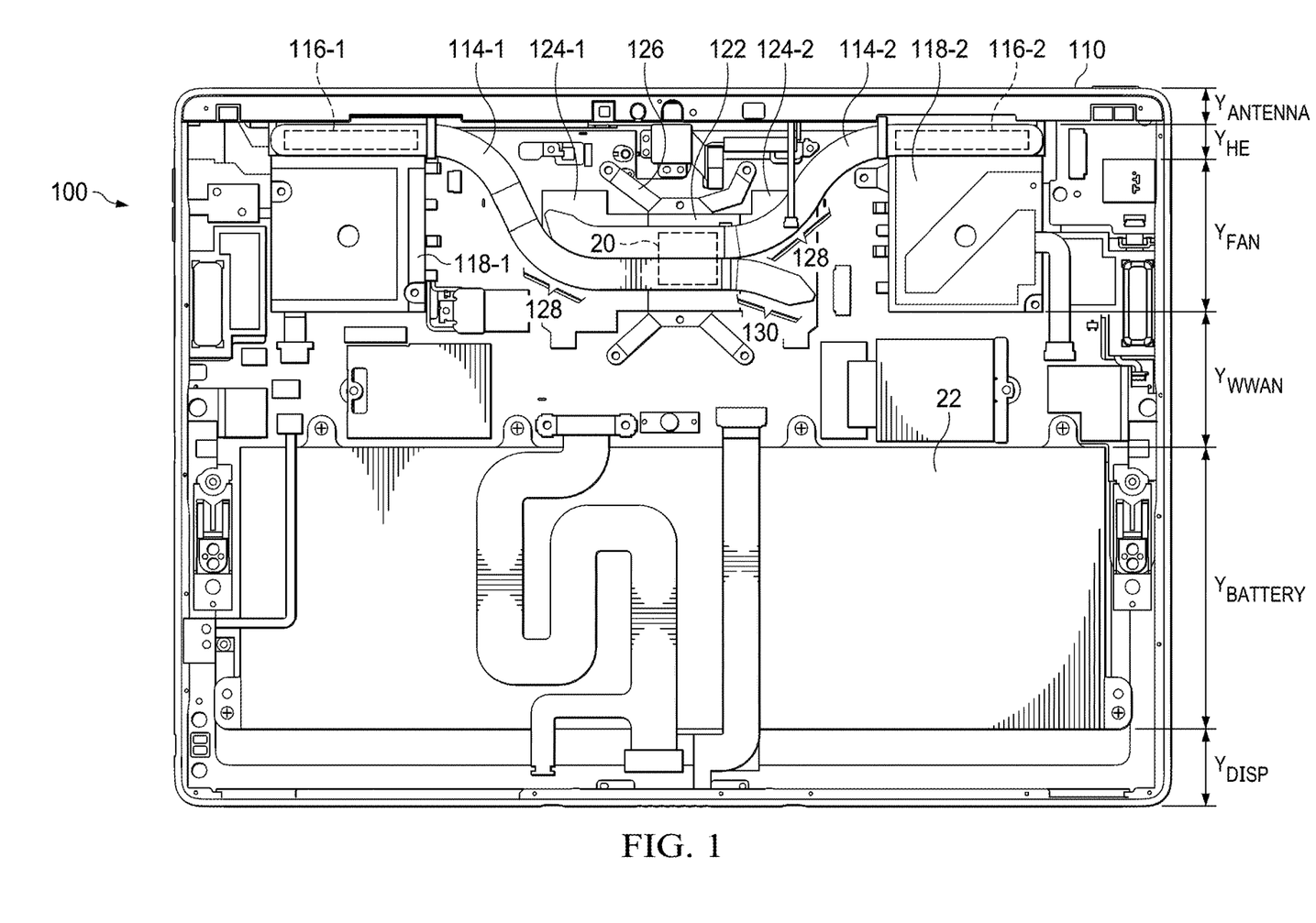
FIG. 1 is a cutaway plan view of a portable chassis with an embodiment of a cooling system comprising an extended thermal battery and two heat pipes.
Figure 2:
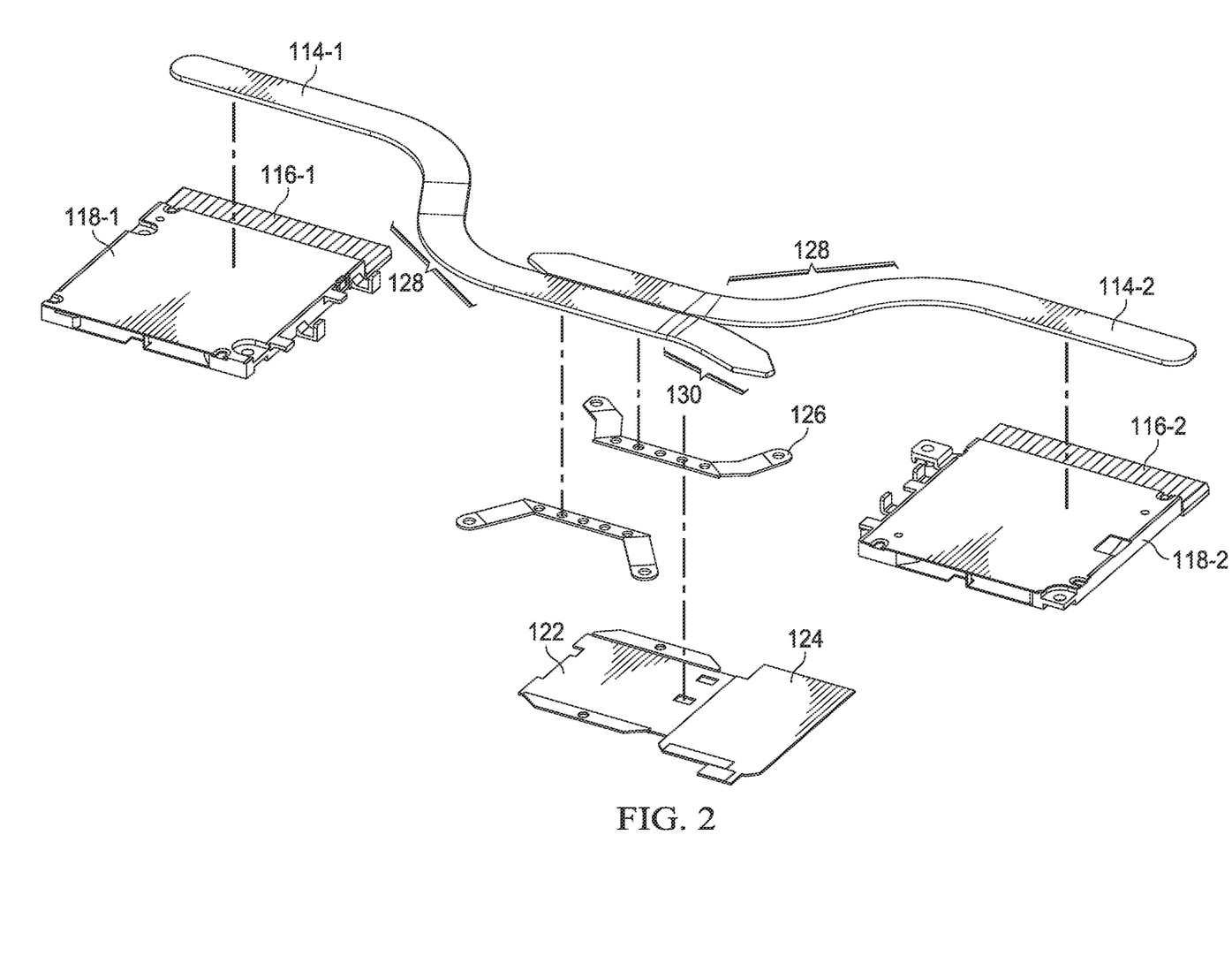
FIG. 2 is a perspective exploded view of one embodiment of a cooling system comprising an extended thermal battery and two heat pipes as depicted in FIG. 1.

As shown in FIG. 1, information handling system 100 may be contained in portable chassis 110. Information handling system 100 may include a processor subsystem, which may comprise processor 20-1 communicatively coupled to a memory subsystem, an I/O subsystem, a local storage resource, and a network interface.

Components 20 of a processor subsystem in information handling system 100 may comprise a system, device, or apparatus operable to interpret and execute program instructions and process data, and may include a microprocessor, microcontroller, digital signal processor (DSP), application specific integrated circuit (ASIC), or another digital or analog circuitry configured to interpret and execute program instructions and process data. In some embodiments, a processor subsystem may interpret and execute program instructions and process data stored locally (e.g., in a memory subsystem). In the same or alternative embodiments, a processor subsystem may interpret and execute program instructions and process data stored remotely (e.g., in a network storage resource). Component 20 depicted in FIG. 1 may be, for example, a central processing unit (CPU) forming part of a processor subsystem.

A memory subsystem in information handling system 100 may comprise a system, device, or apparatus operable to retain and retrieve program instructions and data for a period of time (e.g., computer-readable media). A memory subsystem may comprise random access memory (RAM), electrically erasable programmable read-only memory (EEPROM), a PCMCIA card, flash memory, magnetic storage, opto-magnetic storage, and/or a suitable selection and/or array of volatile or non-volatile memory that retains data after power to its associated information handling system, such as system 100, is powered down.

In information handling system 100, an I/O subsystem may comprise a system, device, or apparatus generally operable to receive and transmit data to or from or within information handling system 100. An I/O subsystem may represent, for example, a variety of communication interfaces, graphics interfaces, video interfaces, user input interfaces, and peripheral interfaces. In various embodiments, an I/O subsystem may be used to support various peripheral devices, such as a touch panel, a display adapter, a keyboard, a touch pad, or a camera, among other examples. In some implementations, an I/O subsystem may support so-called 'plug and play' connectivity to external devices, in which the external devices may be added or removed while information handling system 100 is operating.

A local storage resource in information handling system 100 may comprise computer-readable media (e.g., hard disk drive, floppy disk drive, CD-ROM, and other type of rotating storage media, flash memory, EEPROM, or another type of solid-state storage media) and may be generally operable to store instructions and data.

A network interface in information handling system 100 may be a suitable system, apparatus, or device operable to serve as an interface between information handling system 100 and a network (not shown). A network interface may enable information handling system 100 to communicate over a network using a suitable transmission protocol or standard. In some embodiments, a network interface may be communicatively coupled via a network to a network storage resource (not shown). A network may be implemented as, or may be a part of, a storage area network (SAN), personal area network (PAN), local area network (LAN), a metropolitan area network (MAN), a wide area network (WAN), a wireless local area network (WLAN), a virtual private network (VPN), an intranet, the Internet or another appropriate architecture or system that facilitates the communication of signals, data and messages (generally referred to as data). A network coupled to a network interface may transmit data using a desired storage or communication protocol, including, but not limited to, Fibre Channel, Frame Relay, Asynchronous Transfer Mode (ATM), Internet protocol (IP), other packet-based protocol, small computer system interface (SCSI), Internet SCSI (iSCSI), Serial Attached SCSI (SAS) or another transport that operates with the SCSI protocol, advanced technology attachment (ATA), serial ATA (SATA), advanced technology attachment packet interface (ATAPI), serial storage architecture (SSA), integrated drive electronics (IDE), or any combination thereof. A network coupled to a network interface or various components associated therewith may be implemented using hardware, software, or any combination thereof.

Components 20 in portable chassis 110 may communicate using a system bus comprising a variety of suitable types of bus structures, e.g., a memory bus, a peripheral bus, or a local bus using various bus architectures in selected embodiments. For example, such architectures may include, but are not limited to, Micro Channel Architecture (MCA) bus, Industry Standard Architecture (ISA) bus, Enhanced ISA (EISA) bus, Peripheral Component Interconnect (PCI) bus, PCI-Express bus, HyperTransport (HT) bus, and Video Electronics Standards Association (VESA) local bus.

Cooling System Size is Limited

Referring to the layout of information handling system 100 in portable chassis 110, an X-direction may refer to a width of portable chassis 110 corresponding to left and right directions and a Y-direction may refer to a length of portable chassis 110 corresponding to the top and bottom of FIG. 1.

The size of a cooling system in portable chassis 110 may be more constrained in the Y-direction. For example, $Y_{ANTENNA}$ may refer to the Y-direction component of an antenna region occupied by an antenna (not shown), $Y_{HE}$ may refer to the Y-direction component of a heat exchanger region occupied by heat exchangers 116, $Y_{FAN}$ may refer to the Y-direction component of a fan region occupied by fans 118, $Y_{WWAN}$ may refer to the Y-direction component of a network region occupied by components of a Wireless Wide Area Network (WWAN), $Y_{BATTERY}$ may refer to the Y-direction component of a battery region occupied by battery 22 and $Y_{DISP}$ may refer to the Y-direction component of a display region occupied by components of a display. Decreasing the overall size of portable chassis 110 and/or increasing the size of any of components in these regions may require decreasing one or more other regions. For example, decreasing the size of portable chassis 110 from a 13-inch display to a 12-inch form factor and increasing the size of battery 22 may result in more power available to component 20 and may appeal to users, but each change results in less space available for other components and/or requires a smaller cooling system.

Thermal Batteries Decrease Cooling System Size and Increase Cooling System Performance Die plate 122 may refer to material formed for contact with component 20 for improved heat transfer from component 20 to at least one heat pipe 114. Heat pipes 114 may refer to structures containing a two-phase fluid and a wicking material, wherein heat pipes 114 may be configured for contact with die plate 122 and heat exchangers 116 for transferring heat from die plate 122 to heat exchanger 116. Heat generated by component 20 conducts to die plate 122, wherein contact between the at least one heat pipe 114 and die plate 122 allows heat conduction from die plate 122 to the at least one heat pipe 114. Heat pipes 114 then transport heat to heat exchangers 116.

To increase the amount of heat that can be transferred from die plate 122 to one or more heat pipes 114, one or more thermal batteries 124 may be coupled to die plate 122, wherein each thermal battery 124 has a length and a width such that thermal battery 124 is in contact with heat pipe 114 along a portion of heat pipe 114 between die plate 122 and past curvature 128. An overall size of a thermal battery 124 may be smaller, the same size or larger than die plate 122 but the length and width of thermal battery 124 ensures thermal battery 124 is in contact with heat pipe 114 between die plate 122 and past curvature 128. For example, each thermal battery 124 may be sized between 40% to 150% the size of die plate 122, but thermal battery 124 comprises a length and width such that thermal battery 124 is in contact with heat pipe 114 from die plate 122 to past curvature 128 in heat pipe 114.

Each thermal battery 124 may be formed of a thermally conductive material. In some embodiments, each thermal battery 124 comprises a thermally conductive material such as copper or aluminum. In some embodiments, each thermal battery 124 comprises a vapor chamber comprising a two-phase fluid and wicking material to distribute heat relative to the length and width of thermal battery 124. In some embodiments, each thermal battery 124 comprises a wax material contained between two layers of material, wherein the wax can melt and flow to distribute heat relative to the length and width of thermal battery 124.

In some embodiments, platform 126 may ensure processor, die plate 122 and lateral portions 124 are isolated from other components, printed circuit boards (PCBs) and surfaces of portable chassis 110.

Figure 3:
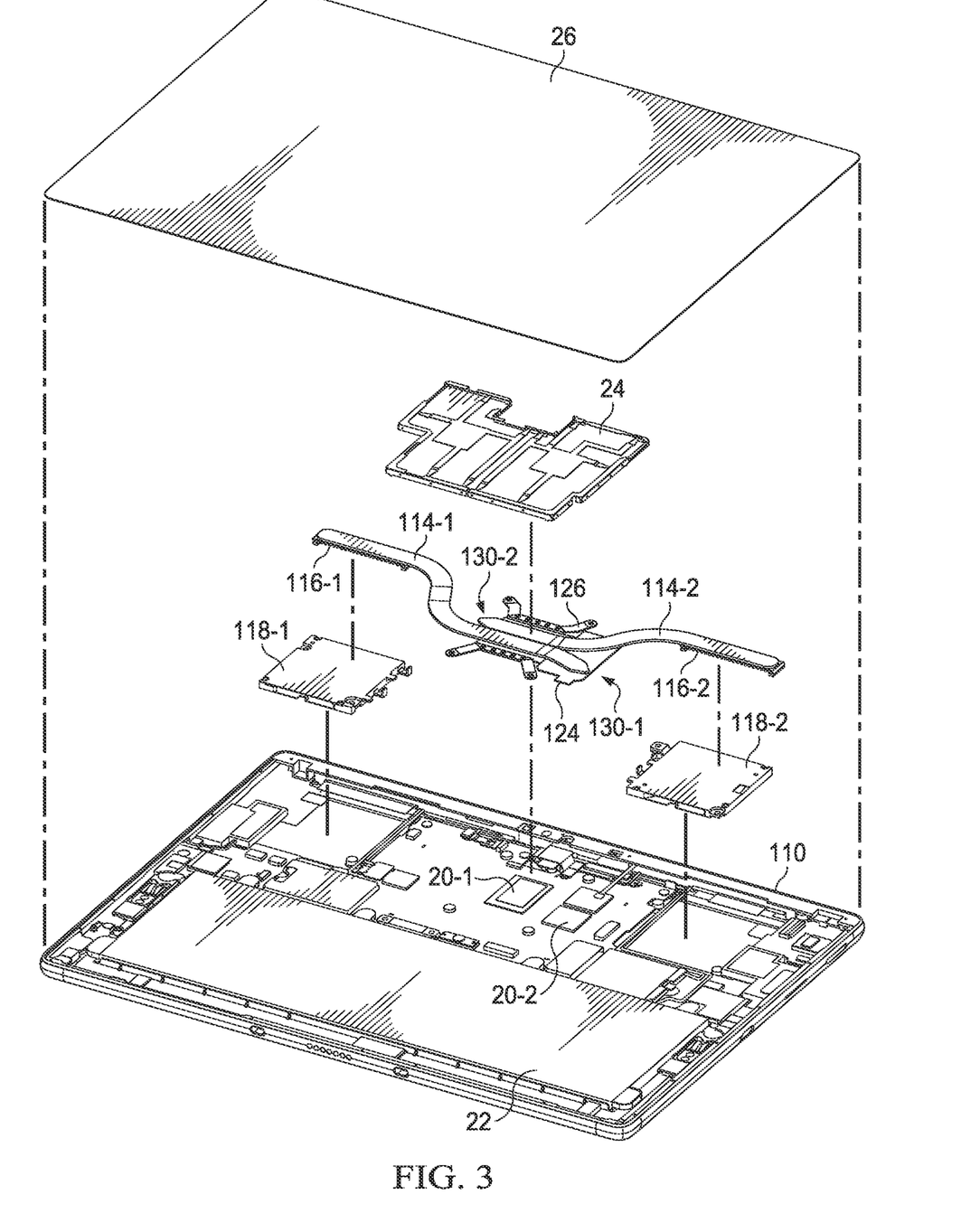
FIG. 3 is a perspective exploded view of a portable chassis comprising one embodiment of a cooling system comprising an extended thermal battery and two heat pipes as depicted in FIG. 1.

FIG. 3 depicts a partial exploded view of one embodiment of a cooling system for cooling components 20 of information handling system 100 in portable chassis 110. As depicted in FIG. 3, a cooling system may be configured to cool multiple components 20, wherein a single thermal battery 124 is coupled to die plate 122 and has a length and width such that thermal battery 124 is in contact with heat pipe 114 between die plate 122 past a curvature 128 in heat pipe 114. Platform 126 may be configured to ensure die plate 122 is coupled to component 20, support die plate 122 and one or more thermal batteries 124 and maintain separation from boards 24 or covers 26 of information handling system 100 or chassis 110.

First heat pipe 114-1 may transfer a first portion of the heat transferred from die plate 122 to first heat exchanger 116-1 such that airflow generated by first fan 118-1 transports the heat out a vent (not shown) to the ambient environment. Second heat pipe 114-2 may transfer a second portion of the heat transferred from die plate 122 to second heat exchanger 116-2 such that airflow generated by second fan 118-2 transports the heat out a vent to the ambient environment.

Thermal battery 124 may have a length and a width configured to ensure thermal battery 124 is in contact with second heat pipe 114-2 from die plate 122 past curvature 128. Thermal battery 124 may have a length and width configured to ensure thermal battery 124 is in contact with second component 20-2 or end 130 of first heat pipe 114-1. First end 130-1 of first heat pipe 114-1 may extend in a first direction relative to the width of portable chassis 110 towards second fan 118-2 such that heat transferred from second component 20-2 is transferred through thermal battery 124 to first heat pipe 114-1. Thus heat from components 20-1 and 20-2 may be transferred via die plate 122 and via thermal battery 124 to both heat pipes 114-1 and 114-2.

Variations of Embodiments of Cooling Systems with Thermal Batteries

FIGS. 4-7 are top views of embodiments of cooling systems comprising die plate 122 in thermal contact with a component 20-1 and at least one thermal battery 124 coupled to die plate 122 and extending laterally past a curvature 128 of heat pipe 114.

Figure 4:
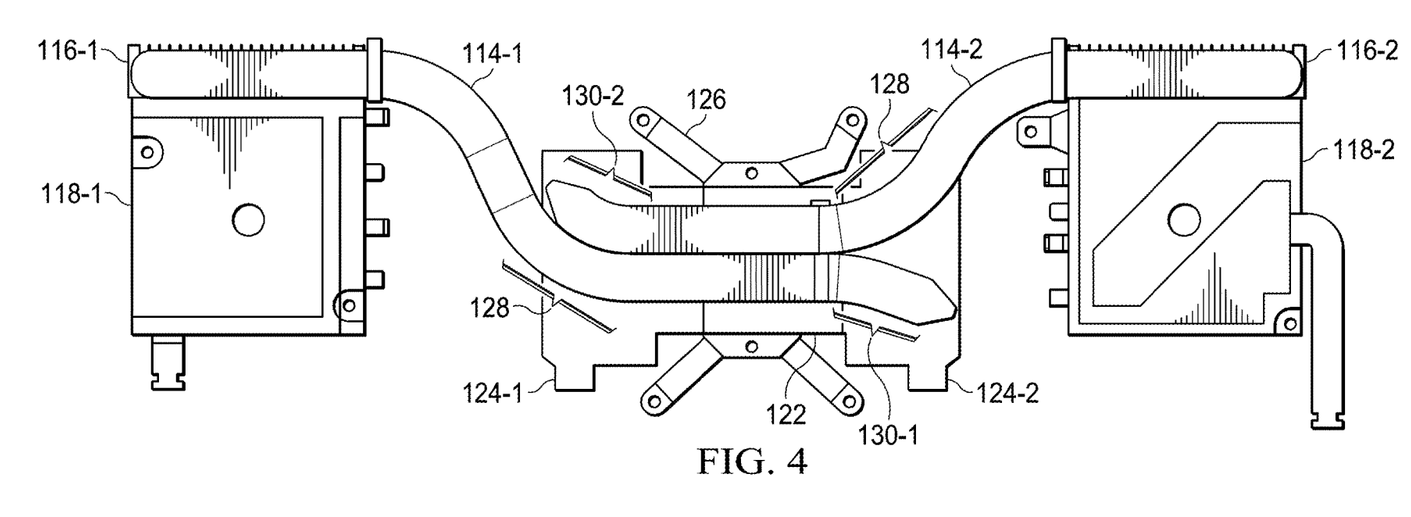
FIGS. 4-7 are top views of embodiments of cooling systems comprising an extended thermal battery and two heat pipes.

FIG. 4 depicts a top view of one embodiment of a cooling system comprising two heat pipes 114-1 and 114-2 coupled to die plate 122 and heat exchangers 116-1 and 116-2, respectively, each heat pipe 114 comprising a curvature 128. Heat pipe 114-1 is configured to transfer heat in a first direction from die plate 122 to heat exchanger 116-1 positioned proximate first fan 118-1 but comprises an end 130-1 extending in a second direction (i.e., toward second fan 118-2). Heat pipe 114-2 is configured to transfer heat in the first direction from die plate 122 to heat exchanger 116-2 positioned proximate second fan 118-2 but comprises an end 130-2 extending in a second direction (i.e., toward first fan 118-1). First thermal battery 124-1 is coupled to die plate 122 and has a length and width such that contact between thermal battery 124 and first heat pipe 114-1 occurs between die plate 122 to a point past curvature 128 in heat pipe 114-1 and contact between thermal battery 124 and second heat pipe 114-2 occurs from die plate 122 past end 130-2 of second heat pipe 114-2. Second thermal battery 124-2 is coupled to die plate 122 and has a length and width such that contact between thermal battery 124 and second heat pipe 114-2 occurs between die plate 122 to a point past curvature 128 in heat pipe 114-2 and contact between thermal battery 124 and first heat pipe 114-1 occurs from die plate 122 past end 130-1 of first heat pipe 114-1.

Figure 5:
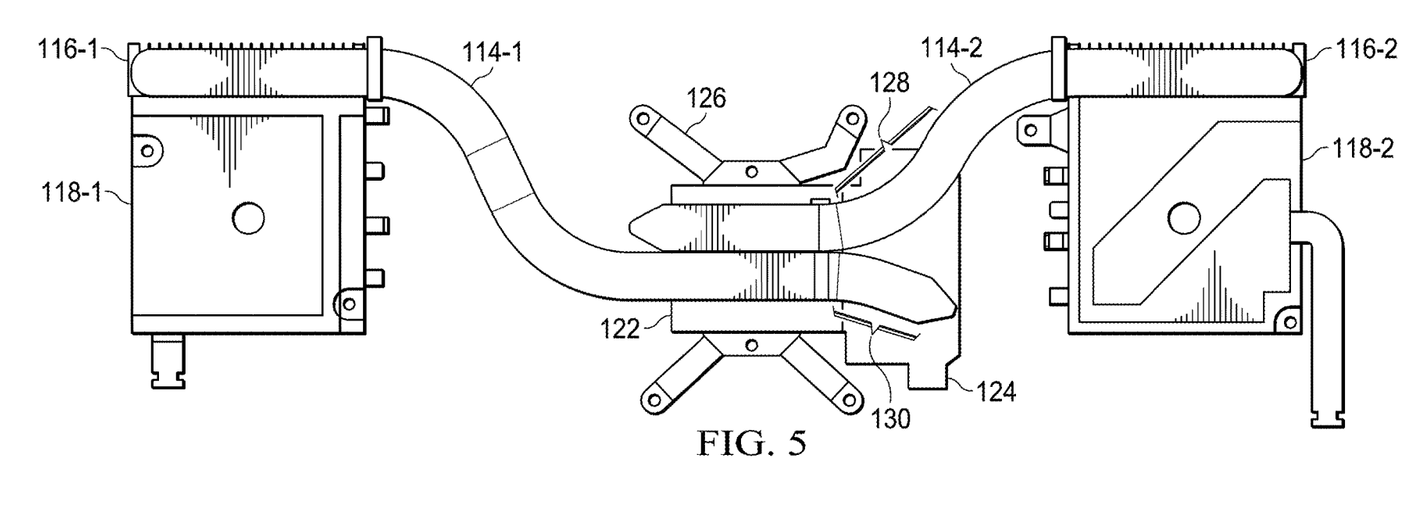

FIG. 5 depicts a top view of one embodiment of a cooling system comprising two heat pipes 114-1 and 114-2 coupled to die plate 122 and heat exchangers 116-1 and 116-2, respectively, each heat pipe 114 comprising a curvature 128 between die plate 122 and heat exchanger 116. Heat pipe 114-1 is configured to transfer heat in a first direction from die plate 122 to heat exchanger 116-1 positioned proximate first fan 118-1 and comprises an end 130 extending in a second direction (i.e., toward second fan 118-2). Heat pipe 114-2 is configured to transfer heat in the second direction from die plate 122 to heat exchanger 116-2 positioned proximate second fan 118-2. Thermal battery 124 is coupled to die plate 122 and has a length and width such that contact between thermal battery 124 and second heat pipe 114-2 occurs between die plate 122 to a point past curvature 128 in heat pipe 114-2 contact between thermal battery 124 and first heat pipe 114-1 occurs from die plate 122 and past end 130 of first heat pipe 114-1.

Figure 6:
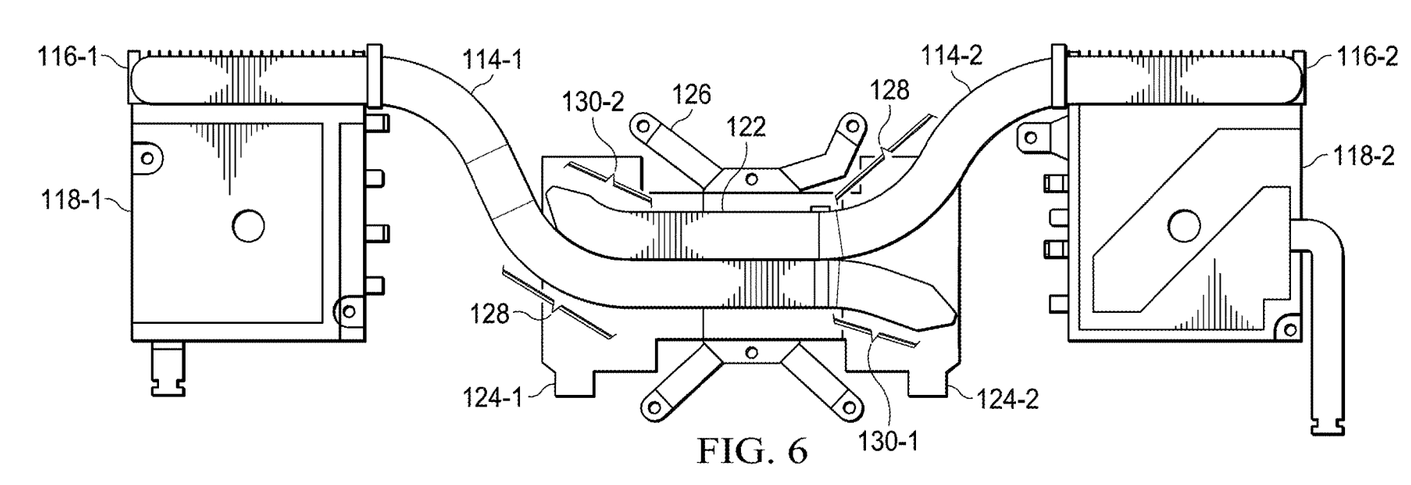

FIG. 6 depicts a top view of one embodiment of a cooling system comprising two heat pipes 114-1 and 114-2 coupled to die plate 122 and heat exchangers 116-1 and 116-2, respectively, each heat pipe 114 comprising a curvature 128 between die plate 122 and heat exchanger 116-1 or 116-2. Heat pipe 114-1 is configured to transfer heat in a first direction from die plate 122 to heat exchanger 116-1 positioned proximate toward first fan 118-1 and comprises an end 130-1 extending in a second direction (i.e., toward second fan 118-2). Heat pipe 114-2 is configured to transfer heat in the second direction from die plate 122 to heat exchanger 116-2 positioned proximate second fan 118-2 and comprises an end 130-2 extending in the first direction toward (i.e., toward first fan 118-1). In embodiments such as depicted in FIG. 6, first thermal battery 124-1 and second thermal battery 124-2 may be formed integrally with die plate 122. First thermal battery 124-1 may refer to a portion of die plate 122 having a length and width such that contact between thermal battery 124 and first heat pipe 114-1 occurs between die plate 122 to a point past curvature 128 in heat pipe 114-1, wherein the length and width ensures thermal battery 124 contacts end 130-2 of second heat pipe 114-2. Second thermal battery 124-2 may refer to a portion of die plate 122 having a length and width such that contact between thermal battery 124 and second heat pipe 114-2 occurs between die plate 122 to a point past curvature 128 in heat pipe 114-2, wherein the length and width ensures thermal battery 124 contacts end 130-1 of first heat pipe 114-1.

Figure 7:
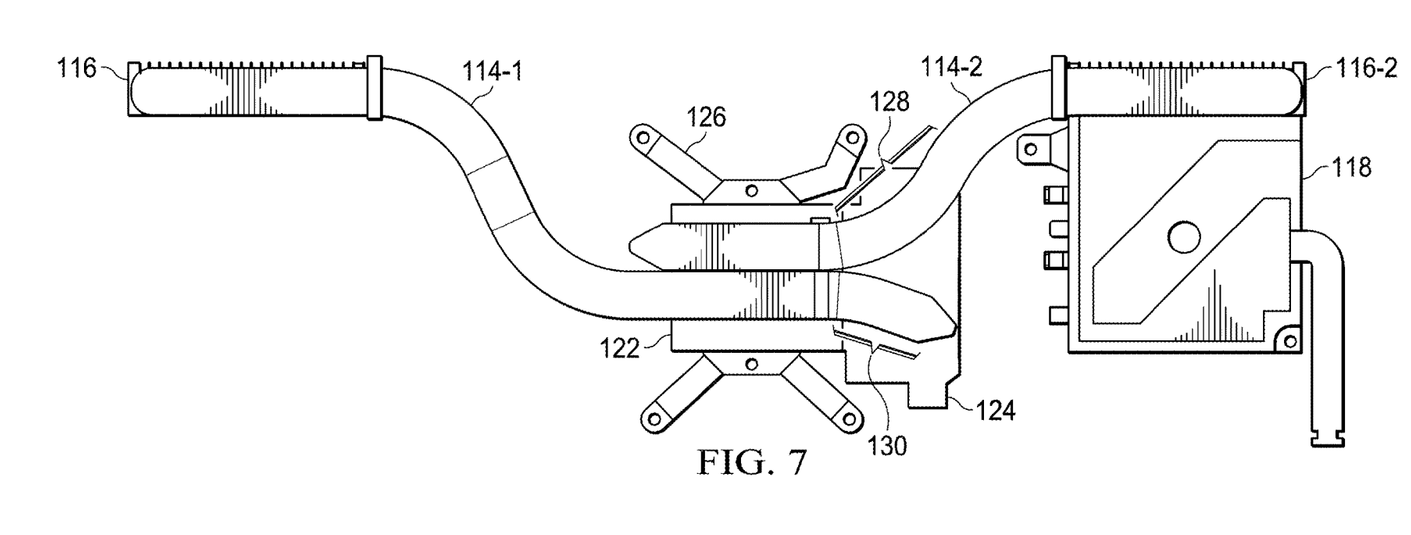

FIG. 7 depicts a top view of one embodiment of a cooling system comprising two heat pipes 114-1 and 114-2 coupled to die plate 122 and heat exchangers 116-1 and 116-2, respectively, each heat pipe 114 comprising a curvature 128. Heat pipe 114-1 is configured to transfer heat in a first direction from die plate 122 (away from fan 118) and comprises an end 130-1 extending in a second direction (i.e. toward fan 118). Heat pipe 114-2 is configured to transfer heat in the second direction from die plate 122 (i.e., toward fan 118) and comprises an end 130-2 extending in the first direction away from fan 118. Thermal battery 124 is coupled to die plate 122 and has a length and width configured such that thermal battery 124 contacts heat pipe 114-2 between die plate 122 to a point past curvature 128 in heat pipe 114-2 and past end 130 of first heat pipe 114-1. Embodiments of a cooling system such as depicted in FIG. 7 may be used in portable chassis 110 that use a single fan 118, wherein more heat may be transferred to second heat pipe 114-2.

The selection or configuration of a cooling system similar to any embodiment depicted in FIGS. 1-7 may be based on components in information handling system 100 contained in portable chassis 110, including cooling, weight and space requirements, a form factor of portable chassis 110 and network requirements. In some embodiments, a cooling system configured similar to any of the cooling systems depicted in FIG. 1-7 may be implemented in a portable chassis 110 having a 12-inch form factor, provide 1.5 hours more battery time, accommodate a fingerprint reader, allow installation of an N-lock, and allow 4G LTE networking capabilities while providing in excess of 30% more power.

Figure 8:
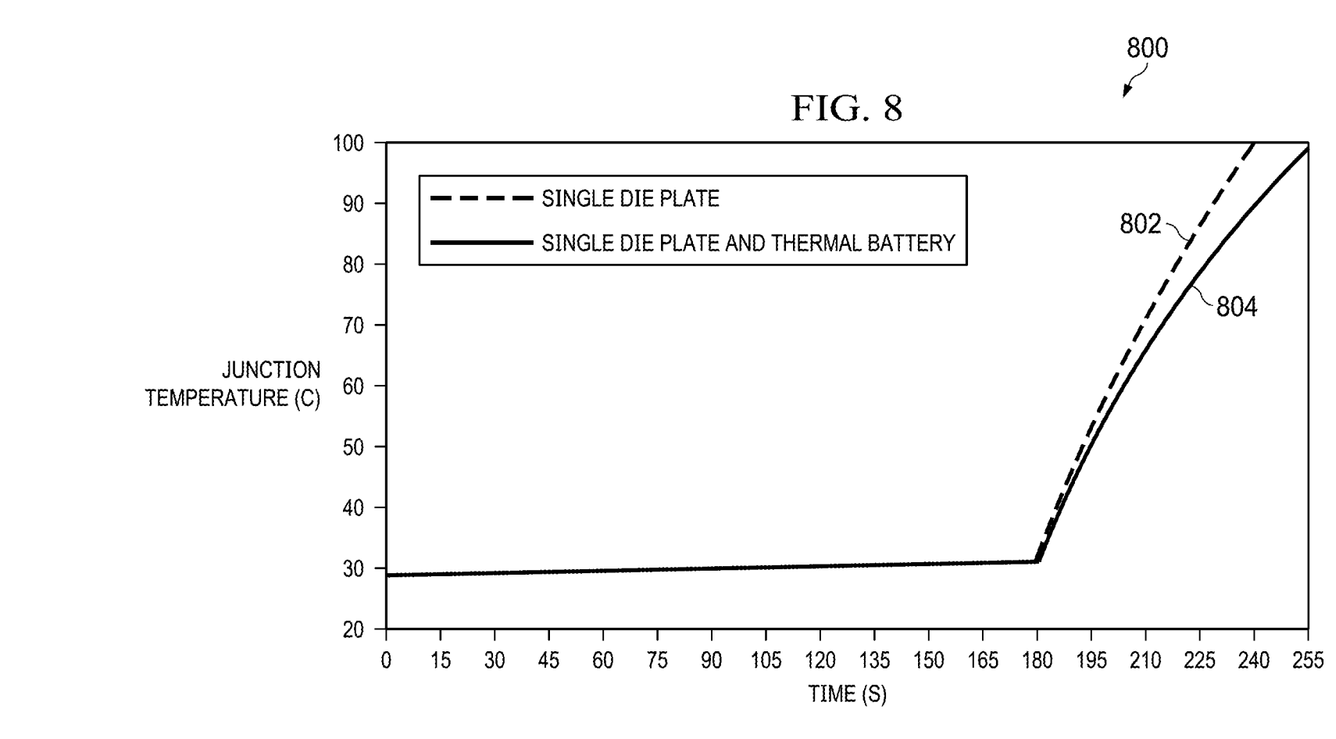
FIG. 8 is a graph depicting junction temperature for a CPU as a function of time for a common cooling system and one embodiment of a cooling system comprising an extended thermal battery and two heat pipes as depicted in FIG. 1.

FIG. 8 is a graph depicting junction temperature for a CPU as a function of time for a cooling system having die plate 122 in contact with two heat pipes 114 and one embodiment of a cooling system comprising die plate 122 and two thermal batteries 124 coupled to die plate 122, wherein each thermal battery 124 has a length and a width configured such that each thermal battery contacts a respective heat pipe 114-1 or 114-2 between die plate 122 to a point past curvature 128 of the respective heat pipe 114-1 or 114-2.

Information handling systems 100 with only die plate 122 having a common size may operate for approximately 60 seconds until a component 20 (e.g. a CPU) reaches the maximum junction temperature of 100 C.

Information handling systems 100 with two thermal batteries 124 coupled to die plate 122, with each thermal battery 124 in contact with a heat pipe 114 and with each battery 124 having a length and width such that thermal battery 124 is in contact with heat pipe 114 from die plate 122 to a point past at least one curvature 128 in heat pipes 114 may operate for approximately 75 seconds until component 20 reaches the maximum junction temperature of 100 C. Embodiments may allow more powerful information handling systems 100 to be arranged in a more compact portable chassis 110 and/or allow for larger batteries 22 but still cool components 20. Embodiments may reduce the overall size of a cooling system and still get a 25% increase in the time for information handling system 100 to reach a maximum operating temperature.

The above disclosed subject matter is to be considered illustrative, and not restrictive, and the appended claims are intended to cover all such modifications, enhancements, and other embodiments which fall within the true spirit and scope of the disclosure. Thus, to the maximum extent allowed by law, the scope of the disclosure is to be determined by the broadest permissible interpretation of the following claims and their equivalents, and shall not be restricted or limited by the foregoing detailed description.

What is claimed is:

1. A cooling system for a component in an information handling system contained in a portable chassis, the cooling system comprising:
 a die plate in thermal contact with the component for receiving heat from the component;
 a heat exchanger positioned near a vent in the portable chassis;
 at least one heat pipe in thermal contact with the die plate and the at least one heat exchanger for transferring heat from the die plate to the at least one heat exchanger, the at least one heat pipe having a curvature between the die plate and the heat exchanger;
 a fan for generating airflow across the heat exchanger to transfer heat from the heat exchanger to an ambient environment; and
 at least one thermal battery coupled to the die plate, the at least one thermal battery having a length and width such that the at least one thermal battery is in contact with the at least one heat pipe from the die plate to a point past the curvature in the at least one heat pipe.

2. The cooling system of claim 1, wherein:
 the at least one heat pipe comprises a first heat pipe in thermal contact with the die plate and a first heat exchanger and a second heat pipe in thermal contact with the die plate and a second heat exchanger; and the at least one thermal battery comprises:
- a first thermal battery coupled to the die plate, the first thermal battery having a length and a width such that the first thermal battery is in contact with the first heat pipe from the die plate to a point past a curvature in the first heat pipe; and
- a second thermal battery coupled to the die plate, the second thermal battery having a length and a width such that the second thermal battery is in contact with the second heat pipe from the die plate to a point past a curvature in the second heat pipe.

3. The cooling system of claim 1, wherein:
the die plate is in thermal contact with a first component; and
the at least one thermal battery is in thermal contact with a second component.

4. The cooling system of claim 3, wherein:
an end of the at least one heat pipe comprises a second curvature; and
the at least one thermal battery has a length and a width such that the at least one thermal battery is in contact with the at least one heat pipe from the die plate to a point past the second curvature.

5. The cooling system of claim 1, wherein the thermal battery comprises a heat chamber comprising a two-phase fluid and a wicking material.

6. The cooling system of claim 1, wherein the thermal battery comprises a two-phase material.

7. The cooling system of claim 6, wherein the two-phase material comprises a wax.

8. The cooling system of claim 1, wherein:
the at least one heat pipe comprises:
- a first heat pipe in contact with the die plate for receiving heat from the die plate and in contact with a first heat exchanger for transferring heat to the first heat exchanger, the first heat pipe having at least one curvature between the die plate and the first heat exchanger; and
- a second heat pipe in contact with the die plate for receiving heat from the die plate and in contact with a second heat exchanger for transferring heat to the second heat exchanger, the second heat pipe having at least one curvature between the die plate and the second heat exchanger; and
- a second thermal battery is coupled to the die plate, the second thermal battery having a length and a width such that the second thermal battery is in contact with the second heat pipe from the die plate to a point past the at least one curvature of the second heat pipe.

9. A portable chassis for an information handling system, the portable chassis comprising:
- a plurality of components of the information handling system;
- a battery for providing power to the plurality of components; and
- a cooling system comprising:
  - a heat exchanger positioned near a vent in the portable chassis;
  - at least one heat pipe in thermal contact with a die plate and the at least one heat exchanger for transferring heat from the die plate to the heat exchanger, the at least one heat pipe having a curvature between the die plate and the heat exchanger;
  - a fan for generating airflow across the heat exchanger to transfer heat from the heat exchanger to an ambient environment; and
  - at least one thermal battery coupled to the die plate, the at least one thermal battery having a length and width such that the at least one thermal battery is in contact with the at least one heat pipe from the die plate to a point past the curvature in the at least one heat pipe.

10. The portable chassis of claim 9, wherein:
the at least one heat pipe comprises a first heat pipe in thermal contact with the die plate and a first heat exchanger and a second heat pipe in thermal contact with the die plate and a second heat exchanger;
the at least one thermal battery comprises:
- a first thermal battery coupled to the die plate, the first thermal battery having a length and a width such that the first thermal battery is in contact with the first heat pipe from the die plate to a point past a curvature in the first heat pipe; and
- a second thermal battery coupled to the die plate, the second thermal battery having a length and a width such that the second thermal battery is in contact with the second heat pipe from the die plate to a point past a curvature in the second heat pipe.

11. The portable chassis of claim 9, wherein:
the die plate is in thermal contact with a first component; and
the at least one thermal battery is in thermal contact with a second component.

12. The portable chassis of claim 11, wherein:
an end of the at least one heat pipe comprises a second curvature; and
the at least one thermal battery has a length and a width such that the at least one thermal battery is in contact with the at least one heat pipe from the die plate to a point past the second curvature.

13. The portable chassis of claim 9, wherein the thermal battery comprises a heat chamber comprising a two-phase fluid and a wicking material.

14. The portable chassis of claim 9, wherein the thermal battery comprises a two-phase material.

15. The portable chassis of claim 14, wherein the two-phase material comprises a wax.

16. The portable chassis of claim 9, wherein:
the at least one heat pipe comprises:
- a first heat pipe in contact with the die plate for receiving heat from the die plate and in contact with a first heat exchanger for transferring heat to the first heat exchanger, the first heat pipe having a curvature between the die plate and the first heat exchanger; and
- a second heat pipe in contact with the die plate for receiving heat from the die plate and in contact with a second heat exchanger for transferring heat to the second heat exchanger, the second heat pipe having a curvature between the die plate and the second heat exchanger; and
the at least one thermal battery comprises:
- a first thermal battery coupled to the die plate, the first thermal battery having a length and a width such that the first thermal battery is in contact with the first heat pipe from the die plate to a point past the curvature of the first heat pipe; and
- a second thermal battery coupled to the die plate, the second thermal battery having a length and a width such that the second thermal battery is in contact with the second heat pipe from the die plate to a point past the curvature of the second heat pipe.

17. An information handling system, comprising:
a plurality of components;
a battery for providing power to the plurality of components; and
a cooling system comprising:
   a heat exchanger positioned near a vent in a portable chassis;
   at least one heat pipe in thermal contact with a die plate and the at least one heat exchanger for transferring heat from the die plate to the heat exchanger, the at least one heat pipe having a curvature between the die plate and the heat exchanger;
   a fan for generating airflow across the heat exchanger to transfer heat from the heat exchanger to an ambient environment; and
   at least one thermal battery coupled to the die plate, the at least one thermal battery having a length and width such that the at least one thermal battery is in contact with the at least one heat pipe from the die plate to a point past the curvature in the at least one heat pipe.

18. The information handling system of claim 17, wherein:
the at least one heat pipe comprises a first heat pipe in thermal contact with the die plate and a first heat exchanger and a second heat pipe in thermal contact with the die plate and a second heat exchanger;
the at least one thermal battery comprises:
   a first thermal battery coupled to the die plate, the first thermal battery having a length and a width such that the first thermal battery is in contact with the first heat pipe from the die plate to a point past a curvature in the first heat pipe
   a second thermal battery coupled to the die plate, the second thermal battery having a length and a width such that the second thermal battery is in contact with the second heat pipe from the die plate to a point past a curvature in the second heat pipe.

19. The information handling system of claim 17, wherein:
the die plate is in thermal contact with a first component; and
the at least one thermal battery is in thermal contact with a second component.

20. The information handling system of claim 17, wherein:
an end of the at least one heat pipe comprises a second curvature; and
the at least one thermal battery has a length and a width such that the at least one thermal battery is in contact with the at least one heat pipe from the die plate to a point past the second curvature.

* * * * *